United States Patent
Zhong et al.

(10) Patent No.: US 9,716,089 B2
(45) Date of Patent: Jul. 25, 2017

(54) SEMICONDUCTOR DEVICE AND ELECTRONIC APPARATUS INCLUDING THE SAME

(71) Applicant: Semiconductor Manufacturing International (Shanghai) Corporation, Shanghai (CN)

(72) Inventors: Hao Zhong, Shanghai (CN); Yunchu Yu, Shanghai (CN); Yihua Shen, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 3 days.

(21) Appl. No.: 14/738,542

(22) Filed: Jun. 12, 2015

(65) Prior Publication Data

US 2016/0013187 A1 Jan. 14, 2016

(30) Foreign Application Priority Data

Jul. 9, 2014 (CN) .......................... 2014 1 0326153

(51) Int. Cl.

| H01L 27/088 | (2006.01) |
|---|---|
| H01L 23/58 | (2006.01) |
| H01L 29/06 | (2006.01) |
| H01L 29/423 | (2006.01) |
| H01L 27/02 | (2006.01) |

(52) U.S. Cl.
CPC ........ *H01L 27/0886* (2013.01); *H01L 23/585* (2013.01); *H01L 29/0619* (2013.01); *H01L 29/4232* (2013.01); *H01L 27/0207* (2013.01); *H01L 2924/0002* (2013.01)

(58) Field of Classification Search
CPC ......... H01L 2924/00; H01L 2924/1305; H01L 2924/1306; H01L 29/41791
See application file for complete search history.

(56) References Cited

U.S. PATENT DOCUMENTS

| 7,217,962 B1* | 5/2007 | Masleid ......... H01L 21/823871 257/202 |
|---|---|---|
| 8,701,055 B1* | 4/2014 | Lee ..................... G06F 17/5081 716/122 |
| 2010/0127347 A1* | 5/2010 | Quinn ................. H01L 23/5223 257/532 |
| 2012/0278777 A1* | 11/2012 | Lin ..................... G06F 17/5081 716/111 |
| 2013/0026572 A1* | 1/2013 | Kawa .................. H01L 27/0207 257/347 |

(Continued)

*Primary Examiner* — Marc Armand
*Assistant Examiner* — Shannon Yi
(74) *Attorney, Agent, or Firm* — Innovation Counsel LLP

(57) ABSTRACT

A semiconductor device includes a plurality of transistor components disposed on a semiconductor substrate, and a guard ring disposed on the semiconductor substrate surrounding the transistor components. The guard ring includes a plurality of fin structures disposed in parallel on the semiconductor substrate, a plurality of first conductive connection members disposed on the fin structures and connecting at least two fin structures, and a plurality of second conductive connection members connecting at least two first conductive connection members. The first conductive connection members and the second conductive connection members are formed as one structure.

13 Claims, 5 Drawing Sheets

(56) References Cited

U.S. PATENT DOCUMENTS

2014/0097496 A1* 4/2014 Hu .................. H01L 21/823481
                                                    257/368
2015/0325532 A1* 11/2015 Hong .................... H01L 29/785
                                                    257/499

* cited by examiner

SEMICONDUCTOR DEVICE AND ELECTRONIC APPARATUS INCLUDING THE SAME

CROSS-REFERENCE TO RELATED APPLICATION

This application claims priority to Chinese Patent Application No. 201410326153.5 filed Jul. 9, 2014, the disclosure of which is incorporated herein by reference in its entirety.

BACKGROUND

Technical Field

The present disclosure generally relates to the field of semiconductor technology, and more particularly to a semiconductor device and an electronic apparatus including the same.

Description of the Related Art

Guard rings are typically used in integrated circuits to reduce disturbances from minority carriers and substrate coupling noise.

Referring to FIG. 1, a semiconductor device may include a plurality of transistor components 101 disposed on a semiconductor substrate 100, and a guard ring 102 disposed on the semiconductor substrate 100 surrounding the transistor components 101. A substrate pickup structure (not shown) may be disposed within the guard ring 102. A region including the guard ring 102 and the substrate pickup structure is typically referred to as a guard ring and substrate pickup region.

In semiconductor devices having conventional transistors, the surface of the semiconductor substrate is usually planar since a fin structure is absent in conventional transistors. Accordingly, the guard ring and substrate pickup region is typically defined by a monolithic active region.

As the semiconductor technology process node continues to scale, an increasing number of semiconductor devices are being manufactured using fin-type field effect transistors (FinFETs). As a result of the fin-type structure, the surface of the semiconductor substrate is no longer planar. Accordingly, the structure of the guard ring needs to be modified in semiconductor devices including FinFETs.

SUMMARY

The present disclosure is directed to the structure of the guard ring in semiconductor devices including FinFETs.

According to an embodiment of the inventive concept, a semiconductor device is provided. The semiconductor device includes: a plurality of transistor components disposed on a semiconductor substrate; a guard ring disposed on the semiconductor substrate surrounding the transistor components, wherein the guard ring comprises: a plurality of fin structures disposed in parallel on the semiconductor substrate; a plurality of first conductive connection members disposed on the fin structures and connecting at least two fin structures; and a plurality of second conductive connection members connecting at least two first conductive connection members, wherein the first conductive connection members and the second conductive connection members are formed as one structure.

In some embodiments, the first conductive connection members and the second conductive connection members may be formed in a mesh configuration.

In some embodiments, the second conductive connection member may be perpendicular to the first conductive connection member.

In some embodiments, the second conductive connection members may have a same width, and adjacent second conductive connection members may be spaced apart by a same distance.

In some embodiments, the first conductive connection members may have a same width, and adjacent first conductive connection members may be spaced apart by a same distance.

In some embodiments, the first conductive connection members may be perpendicular to the fin structures.

In some embodiments, the fin structures may have a same width, and adjacent fin structures may be spaced apart by a same distance.

In some embodiments, the guard ring may further include a plurality of dummy gates disposed on the fin structures, and the dummy gates may be parallel to the first conductive connection members.

In some embodiments, the dummy gates and the first conductive connection members may be spaced apart from each other.

In some embodiments, the dummy gates may have a same width, and adjacent dummy gates may be spaced apart by a same distance.

In some embodiments, a long edge of the dummy gates and a short edge of the fin structures may be aligned in an edge region of the guard ring.

In some embodiments, the guard ring may further include a metal silicide disposed in a region where the first conductive connection members overlap with the fin structures.

In some embodiments, the metal silicide may be disposed on a bottom portion of the first conductive connection members and a top portion of the fin structures.

In some embodiments, the transistor components may include at least one fin-type field effect transistor.

According to another embodiment of the inventive concept, an electronic apparatus is provided. The electronic apparatus includes: at least one electronic component; a semiconductor device electrically connected to the electronic component, wherein the semiconductor device comprises: a plurality of transistor components disposed on a semiconductor substrate; a guard ring disposed on the semiconductor substrate surrounding the transistor components, wherein the guard ring comprises: a plurality of fin structures disposed in parallel on the semiconductor substrate; a plurality of first conductive connection members disposed on the fin structures and connecting at least two fin structures; a plurality of second conductive connection members connecting at least two first conductive connection members, wherein the first conductive connection members and the second conductive connection members are formed as one structure.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION

Figure 1:
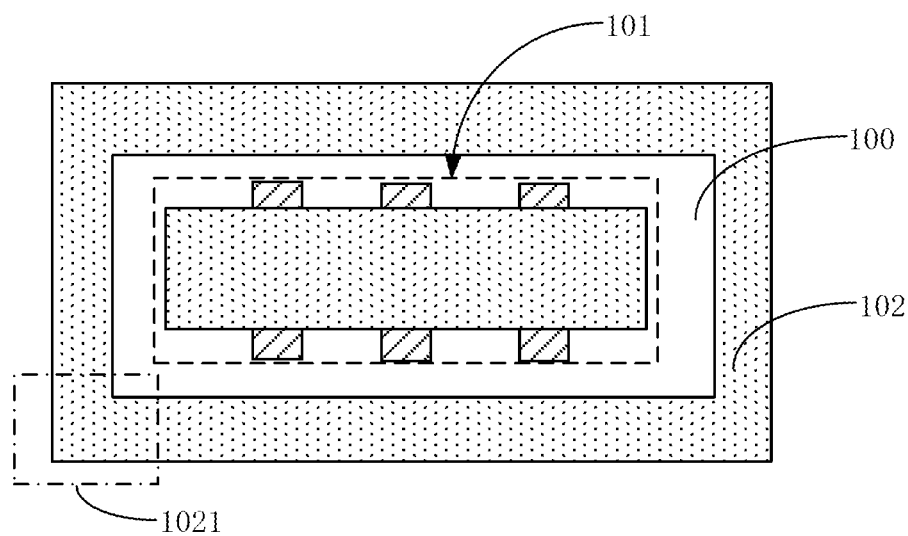
FIG. 1 illustrates a schematic view of a semiconductor device.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale. In the drawings, the size and/or relative sizes of layers and regions may be exaggerated for clarity. Like reference numerals denote the same elements throughout.

Ordinary skill in the relevant art known techniques, methods and apparatus may not be discussed in detail, but in the application of these techniques, methods and apparatus, these techniques, methods and apparatus should be considered as part of this specification.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

It should be understood that when an element or layer is referred to as "in", "on", "adjacent to", "connected to", or "coupled to" another element or layer, it can be directly on the other element or layer, adjacent, connected or coupled to the other element or layer, or with one or more intervening elements or layers being present. In contrast, when an element is referred to as being "directly on," "directly adjacent with", "directly connected to" or "directly coupled to" another element or layer, no intervening elements or layers are present.

It will be understood that, although the terms "first," "second," "third," etc. may be used herein to describe various elements, the elements should not be limited by those terms. Instead, those terms are merely used to distinguish one element from another. Thus, a "first" element discussed below could be termed a "second "element without departing from the teachings of the present inventive concept. As used herein, the term "and/or" includes any and all combinations of one or more of the associated listed items.

Spatially relative terms, such as "below," "lower," "under," "above," "upper" and the like, may be used herein to describe the spatial relationship of one element or feature to another element(s) or feature(s) as illustrated in the figures. It will be understood that the spatially relative terms are intended to encompass different orientations of the device during use or operation, in addition to the orientation depicted in the figures. For example, if the device in the figures is turned over, elements described as "below" or "beneath" relative to other elements or features would then be oriented "above" relative to the other elements or features. Thus, the example term "below" can encompass both an orientation of above and below, depending on the orientation of the elements. The device may be otherwise oriented (rotated 90 degrees or at other orientations) and the spatially relative descriptors used herein interpreted accordingly.

The inventive concept will be herein described with reference to cross-sections of intermediate and final structures of different embodiments. The cross-sections are merely illustrative and are not drawn to scale. Furthermore, it should be noted that the shapes of the intermediate and final structures may vary due to different tolerances in manufacturing. As such, the inventive concept is not limited to the embodiments illustrated in the drawings, but may further include variations in shapes as a result of different manufacturing tolerances. For example, an implanted region (depicted as a rectangle in the drawings) may have generally rounded or curved edges depending on the gradient in the ion implant concentration. Therefore, the areas/shapes illustrated in the figures are merely schematic, and should not be construed to limit the inventive concept.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

It should be understood that the inventive concept is not limited to the embodiments described herein. Rather, the inventive concept may be modified in different ways to realize different embodiments.

According to embodiments of the inventive concept, a semiconductor device includes a plurality of transistor components disposed on a semiconductor substrate, and a guard ring disposed on the semiconductor substrate surrounding the transistor components. A pickup structure may be disposed within the guard ring. In some embodiments of the semiconductor device, the transistor components may include fin-type field effect transistors (FinFETs). The guard ring may be formed in a rectangular shape or any other appropriate shapes.

Figure 2A:
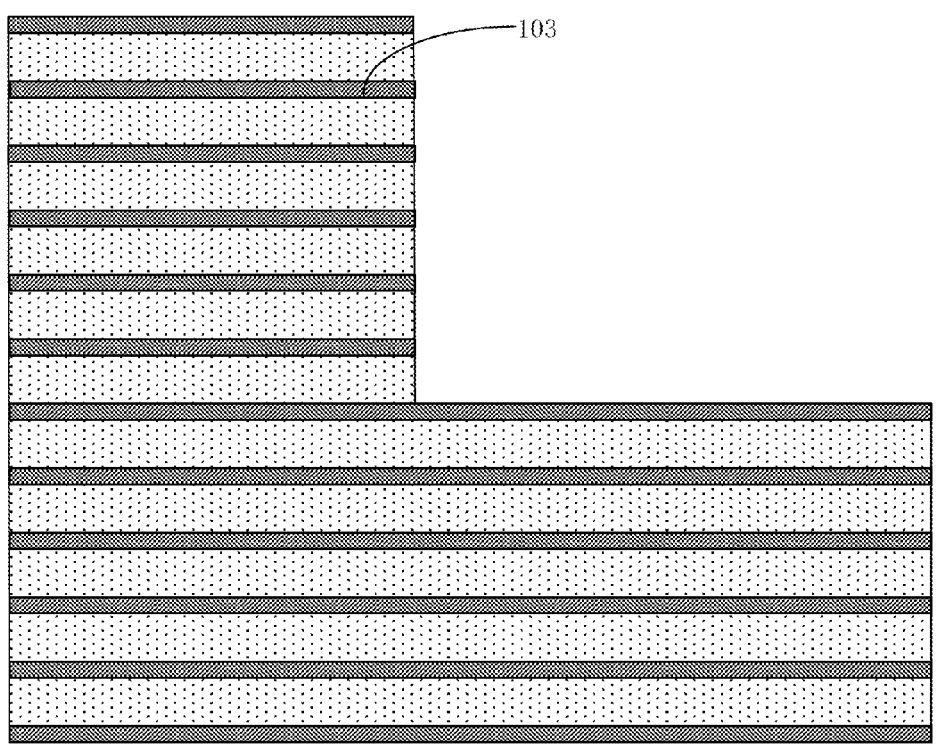
FIG. 2A illustrates a schematic layout of a guard ring portion of a semiconductor device including fin-type field effect transistors.

FIG. 2A illustrates a portion of a guard ring in a semiconductor device including FinFETs. Specifically, FIG. 2A illustrates the portion of the guard ring at a location similar to region 1021 of the guard ring 102 of FIG. 1. As shown in FIG. 2A, the guard ring includes a plurality of fin structures 103 spaced apart from each other. Since the fin structures 103 are not connected to one another, there is no electrical connection between the fin structures 103.

Figure 2B:
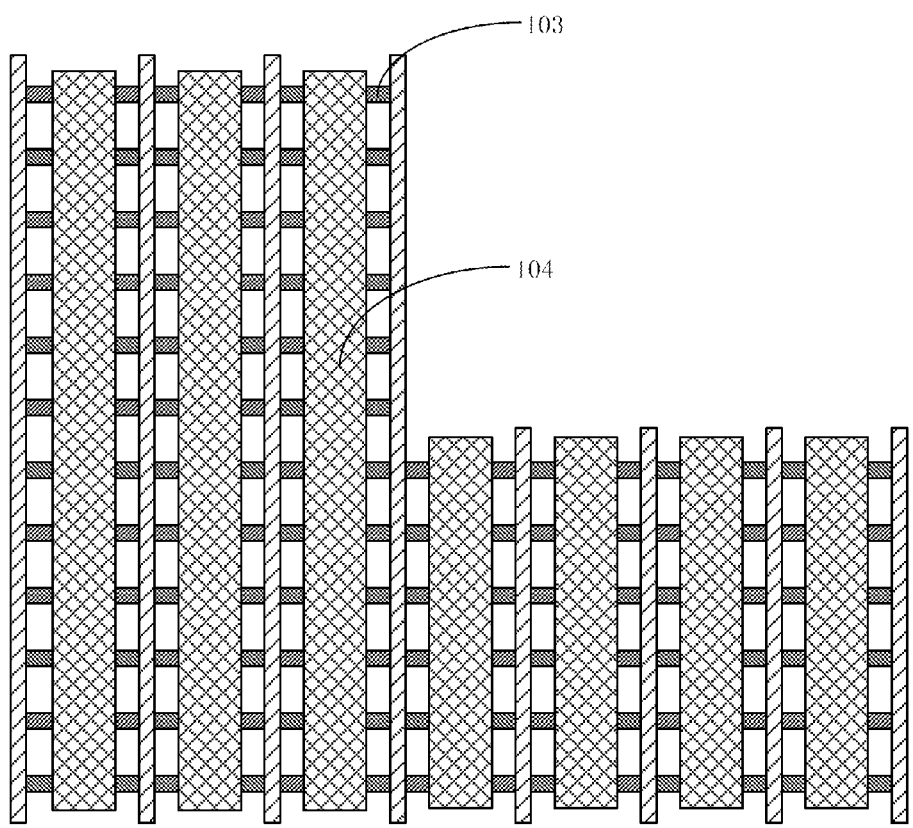
FIG. 2B illustrates a schematic layout of a guard ring portion of another semiconductor device including fin-type field effect transistors.

The fin structures 103 are electrically connected together in the structure illustrated in FIG. 2B. As shown in FIG. 2B, the guard ring includes the fin structures 103 arranged in parallel. In addition, a plurality of first conductive connection members 104 are disposed on the fin structures 103 in a first direction and electrically connect at least two fin structures 103. Since adjacent first conductive connection members 104 are not electrically connected to each other, the electrical connection between the fin structures 103 may have high resistance.

To electrically connect the first conductive connection members 104 together, metal interconnects are formed during back-end-of-line (BEOL) processing. A low resistivity guard ring is obtained after the first conductive connection members 104 are electrically connected together. However, as mentioned above, the low resistivity guard ring is only obtained after metal interconnects are formed during BEOL processing. As a result, the guard ring may not be fully effective (in reducing substrate coupling noise, for example) prior to BEOL processing.

Figure 3:
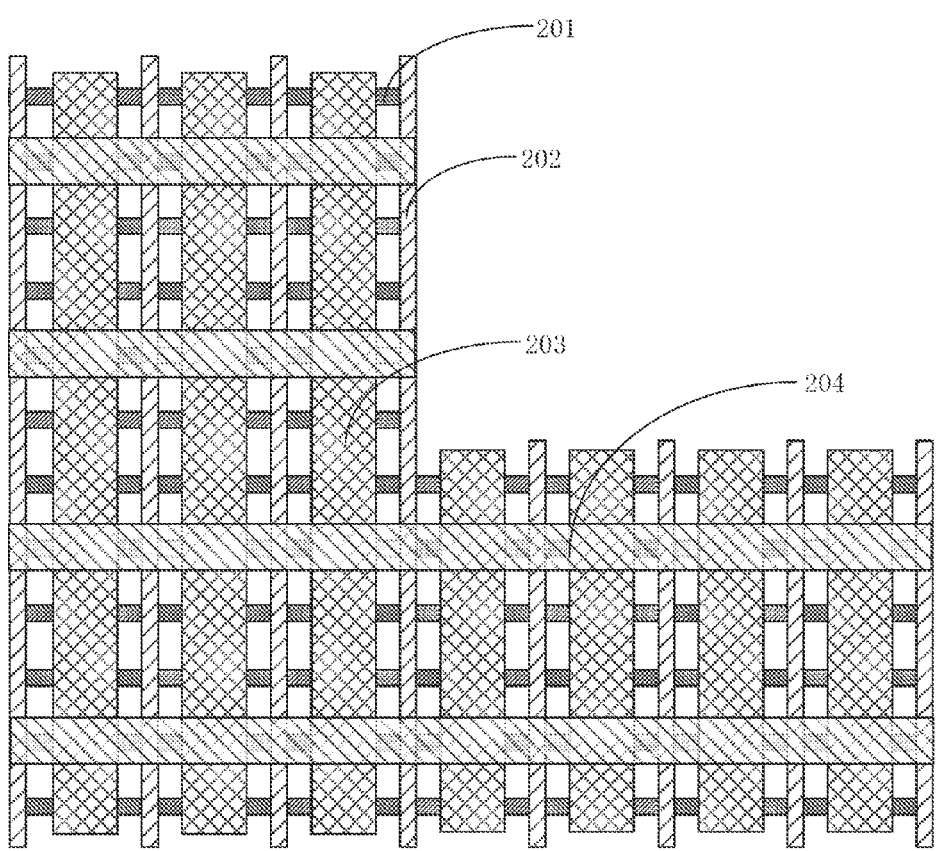
FIG. 3 illustrates a schematic layout of a guard ring portion of a semiconductor device according to an embodiment.
Figure 4A:
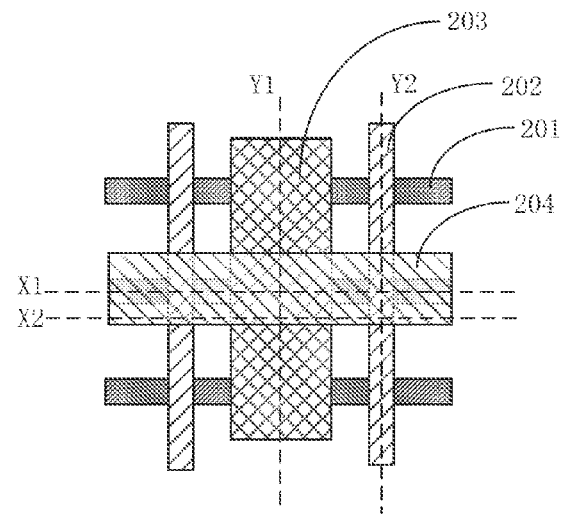
FIG. 4A illustrates a magnified view of a section of the schematic layout of FIG. 3.
Figure 4B:
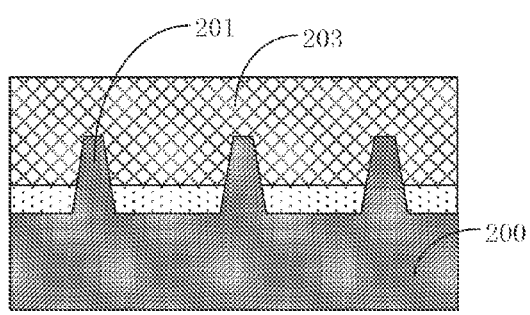
FIG. 4B illustrates a cross-sectional view taken along direction Y1 of FIG. 4A.
Figure 4C:
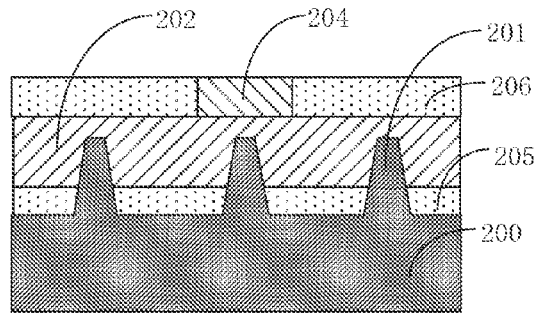
FIG. 4C illustrates a cross-sectional view taken along direction Y2 of FIG. 4A.

Next, the structure of a guard ring in a semiconductor device according to an embodiment will be described in detail with reference to FIGS. 3, 4A, 4B, 4C, 4D, and 4E. Specifically, FIG. 3 illustrates a schematic layout of a portion of the guard ring in the semiconductor device; FIG. 4A illustrates a magnified view of a section of the schematic layout of FIG. 3; and FIGS. 4B, 4C, 4D, and 4E illustrate cross-sectional views of the guard ring taken along directions Y1, Y2, X1, and X2 of FIG. 4A, respectively.

Referring to FIG. 3, the guard ring of the exemplary semiconductor device includes a plurality of fin structures 201 disposed in parallel on a substrate (not shown), and a plurality of first conductive connection members 203 disposed on the fin structures 201 and connecting at least two fin structures 201. The guard ring further includes a plurality of second conductive connection members 204 connecting at least two first conductive connection members 203. The first conductive connection members 203 and the second conductive connection members 204 are formed as one structure.

In some embodiments, the first conductive connections members 203 are disposed perpendicularly to the fin structures 201.

The first conductive connection members 203 may be made of a metal or any other conductive materials (e.g., metal silicide). In some embodiments, the first conductive connection members 203 may be formed of a first metal layer in the semiconductor device manufacturing process.

In some embodiments, the first conductive connection members 203 have a same width, and adjacent first conductive connection members 203 are spaced apart by a same distance. In other words, the first conductive connection members 203 may have a constant width and pitch.

In some embodiments, the fin structures 201 have a same width, and adjacent fin structures 201 are spaced apart by a same distance. In other words, the fin structures 201 may have a constant width and pitch.

In addition, the guard ring may further include a plurality of dummy gates 202. The dummy gates 202 may be disposed between adjacent first conductive connection members 203, and/or at an outer periphery of the first conductive connection members 203 at an edge region of the guard ring. The dummy gates 202 may be disposed on an upper portion of the fin structures 201. As shown in FIG. 3, the dummy gates 202 may be disposed perpendicularly to the fin structures 201 and in parallel with the first conductive connection members 203. The dummy gates 202 may be made of polysilicon or any other suitable materials. The dummy gates 202 may be formed simultaneously with other dummy gates in the transistor components using a same process. The dummy gates 202 are added to improve device/structural uniformity. Specifically, the dummy gates 202 render the structure of the guard ring similar to that of the transistor components, which makes the semiconductor device manufacturing process more controlled.

In some embodiments, the dummy gates 202 have a same width, and adjacent dummy gates 202 are spaced apart by a same distance. When the dummy gates 202 have a constant width and pitch, greater control over the critical dimension of the dummy gates 202 can be achieved.

In some embodiments, a long edge of the dummy gates 202 and a short edge of the fin structures 201 are aligned in an edge region of the guard ring, as shown in FIG. 3. By aligning the edges of the dummy gates 202 and the fin structures 201 in the above configuration, the manufacturing yield of the semiconductor device can be improved.

Since the second conductive connection members 204 electrically connect the first conductive connection members 203, the guard ring of the semiconductor device thus functions as a low resistivity guard ring and is more effective, for example, in preventing latch-up effect. The guard ring is also more effective when the first conductive connection members 203 and the second conductive connection members 204 are formed as one structure (instead of independent structures).

As previously described with reference to FIG. 2B, electrical conductivity between adjacent first conductive connection members 203 in the guard ring can be achieved through the metal interconnect process during BEOL processing, such that a low resistivity guard ring is formed after BEOL processing. However, in the embodiment of FIG. 3, the second conductive connection members 204 are formed prior to BEOL processing. As a result, in the embodiment of FIG. 3, a low resistivity guard ring is in place (after forming the second conductive connection members 204) prior to BEOL processing. Also, by forming the first conductive connection members 203 and the second conductive connection members 204 as one structure, the resistance of the guard ring can be further reduced, thereby improving the effectiveness of the guard ring.

In some embodiments, the second conductive connection members 204 and the first conductive connection members 203 intersect perpendicularly. In those embodiments, the second conductive connection members 204 are parallel to the fin structures 201, and the first conductive connection members 203 are parallel to the dummy gates 202.

In some embodiments, the second conductive connection members 204 and the first conductive connection members 203 are formed in a mesh configuration, as shown in FIG. 3. The mesh configuration can improve the electrical connection between the second conductive connection members 204 and the first conductive connection members 203.

In some embodiments, the second conductive connection members 204 have a same width, and adjacent second conductive connection members 204 are spaced apart by a same distance. Accordingly, device uniformity can be improved.

The second conductive connection members 204 may be made of a metal or any other appropriate conductive materials (e.g., metal silicide). In some embodiments, the second conductive connection members 204 may be formed of a metal gate in the semiconductor device manufacturing process.

In some embodiments, the guard ring of the exemplary semiconductor device may further include spacers on sidewalls of the dummy gate 202 and a metal silicide. The metal silicide may be disposed in a region where the first conductive connection members 203 overlap with the fin structures 201. Specifically, the metal silicide may be disposed on a lower portion of the first conductive connection members 203 and an upper portion of the fin structures 201. For example, the metal silicide may be disposed below the first conductive connection members 203 and above the fin structures 201.

FIGS. 4A through 4E illustrate the structure of the guard ring in the exemplary semiconductor device in further detail. Specifically, FIG. 4A illustrates a magnified view of a section of the schematic layout of FIG. 3, and FIGS. 4B, 4C, 4D, and 4E illustrate cross-sectional views of the guard ring taken along directions Y1, Y2, X1, and X2 of FIG. 4A, respectively.

Referring to FIGS. 4A through 4E, the guard ring includes the fin structures 201 disposed in parallel on the semiconductor substrate 200, the first conductive connection members 203 disposed on the fin structures 201 and connecting at least two fin structures 201, the second conductive connection member 204 connecting at least two first conductive connection members 203, and the dummy gates 202.

Figure 4D:
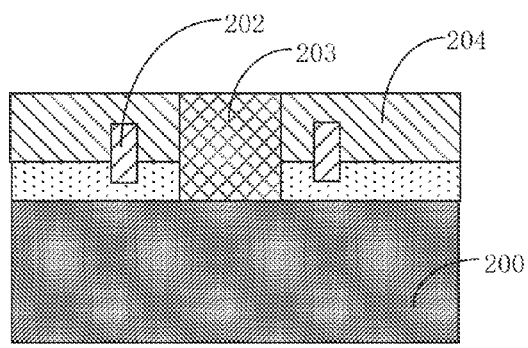
FIG. 4D illustrates a cross-sectional view taken along direction X1 of FIG. 4A.
Figure 4E:
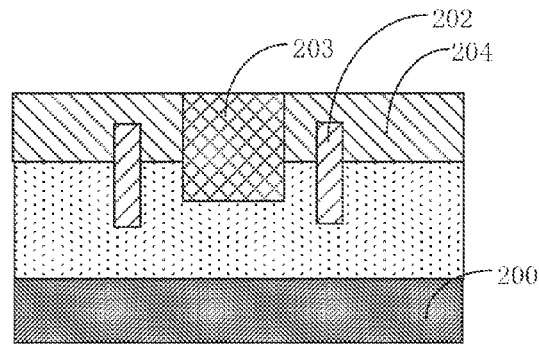
FIG. 4E illustrates a cross-sectional view taken along direction X2 of FIG. 4A.

As shown in FIGS. 4D and 4E, the first conductive connection members 203 and the second conductive connection members 204 are formed as one structure, without any gap between the first conductive connection members 203 and the second conductive connection members 204. The first conductive connection members 203 and the second conductive connection members 204 may be made of a same material. In some embodiments, the first conductive connection members 203 and the second conductive connection members 204 may be formed simultaneously using a physical vapor deposition (PVD) process.

Spacers are formed on sidewalls of the dummy gate 202. In the interest of clarity, the spacers have been omitted from the drawings (FIGS. 4A through 4E). FIGS. 4B, 4C, 4D, and 4E further illustrate other elements of the semiconductor device, e.g., a semiconductor substrate 200, a shallow trench isolation structure 205, and a dielectric layer 206.

According to embodiments of the inventive concept, a guard ring of a semiconductor device includes a plurality of first conductive connection members disposed on fin structures and connecting at least two fin structures, and a plurality of second conductive connection members connecting at least two first conductive connection members. The second conductive connection members electrically connect the first conductive connection members to one another. The second conductive connection members and the first conductive connection members are formed as one structure. Accordingly, a low resistivity guard ring is obtained using the above configuration.

It is noted that the semiconductor device of any one of FIGS. 2A, 2B, 3, 4A, 4B, 4C, 4D, and 4E may be incorporated into an electronic apparatus. The semiconductor device may be connected to other electronic components. As previously described, the semiconductor device includes a low resistivity guard ring. In some embodiments, the semiconductor device can be formed on a chip that is then incorporated into the electronic apparatus. The electronic apparatus may include mobile phones, tablet PCs, laptops, netbooks, game consoles, TVs, VCD players, DVD players, navigation systems, cameras, video cameras, voice recorders, MP3/MP4 players, PSPs, and any other electronic products or devices. The semiconductor device may also be incorporated into an intermediate product. The intermediate product may be used as stand-alone device, or integrated with other components to form a finished electronic product or device.

Embodiments of a semiconductor device and an electronic apparatus including the semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

Different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept. Therefore, the inventive concept should not be limited to the foregoing disclosure, but rather construed by the claims appended hereto.

What is claimed is:

1. A semiconductor device comprising:
   a plurality of transistor components disposed on a semiconductor substrate;
   a guard ring disposed on the semiconductor substrate surrounding the transistor components, wherein the guard ring comprises:
      a plurality of fin structures disposed in parallel on the semiconductor substrate in a first direction such that each of the fin structures is physically isolated from each other;
      a plurality of first conductive connection members disposed on the fin structures in a second direction and electrically connecting at least two fin structures;
      a plurality of dummy gates disposed on the fin structures between adjacent first conductive connection members in the second direction, wherein the dummy gates are parallel to the first conductive connection members, and each of the plurality of dummy gates is separated from the semiconductor substrate by a shallow trench isolation structure, and wherein a long edge of the dummy gates and a short edge of the fin structures are aligned in an edge region of the guard ring; and
      a plurality of second conductive connection members disposed on the dummy gates in the first direction and electrically connecting at least two first conductive connection members,
      wherein the first conductive connection members and the second conductive connection members are formed as one structure, and
      wherein a top surface of the first conductive connection members and the second conductive connection members is planar and is higher than a top surface of the dummy gates.

2. The semiconductor device according to claim 1, wherein the first conductive connection members and the second conductive connection members are formed in a mesh configuration.

3. The semiconductor device according to claim 1, wherein the second conductive connection member are perpendicular to the first conductive connection members.

4. The semiconductor device according to claim 1, wherein the second conductive connection members have a same width, and wherein adjacent second conductive connection members are spaced apart by a same distance.

5. The semiconductor device according to claim 1, wherein the first conductive connection members have a same width, and wherein adjacent first conductive connection members are spaced apart by a same distance.

6. The semiconductor device according to claim 1, wherein the first conductive connection members are perpendicular to the fin structures.

7. The semiconductor device according to claim 1, wherein the fin structures have a same width, and wherein adjacent fin structures are spaced apart by a same distance.

8. The semiconductor device according to claim 1, wherein the dummy gates and the first conductive connection members are spaced apart from each other.

9. The semiconductor device according to claim 1, wherein the dummy gates have a same width, and wherein adjacent dummy gates are spaced apart by a same distance.

10. The semiconductor device according to claim 1, wherein the guard ring further comprises a metal silicide disposed in a region where the first conductive connection members overlap with the fin structures.

11. The semiconductor device according to claim 1, wherein the transistor components comprise at least one fin-type field effect transistor.

12. The semiconductor device according to claim 10, wherein the metal silicide is disposed on a bottom portion of the first conductive connection members and a top portion of the fin structures.

13. An electronic apparatus comprising:
at least one electronic component;
a semiconductor device electrically connected to the electronic component, wherein the semiconductor device comprises:
  a plurality of transistor components disposed on a semiconductor substrate;
  a guard ring disposed on the semiconductor substrate surrounding the transistor components, wherein the guard ring comprises:
    a plurality of fin structures disposed in parallel on the semiconductor substrate in a first direction such that each of the fin structures is physically isolated from each other;
    a plurality of first conductive connection members disposed on the fin structures in a second direction and electrically connecting at least two fin structures;
    a plurality of dummy gates disposed on the fin structures between adjacent first conductive connection members in the second direction, wherein the dummy gates are parallel to the first conductive connection members, and each of the plurality of dummy gates is separated from the semiconductor substrate by a shallow trench isolation structure, and wherein a long edge of the dummy gates and a short edge of the fin structures are aligned in an edge region of the guard ring; and
    a plurality of second conductive connection members disposed on the dummy gates in the first direction and electrically connecting at least two first conductive connection members,
  wherein the first conductive connection members and the second conductive connection members are formed as one structure, and
  wherein a top surface of the first conductive connection members and the second conductive connection members is planar and is higher than a top surface of the dummy gates.

* * * * *